(12) United States Patent
Puckett et al.

(10) Patent No.: US 12,188,998 B2
(45) Date of Patent: Jan. 7, 2025

(54) INTEGRATED PHOTONICS MAGNETOMETER BASED ON A NONLINEAR DIAMOND-CONTAINING RESONATOR

(71) Applicant: Honeywell International Inc., Charlotte, NC (US)

(72) Inventors: Matthew Wade Puckett, Phoenix, AZ (US); Neal Eldrich Solmeyer, Edina, MN (US); Mary Salit, Plymouth, MN (US); Jianfeng Wu, Tucson, AZ (US); Matthew Robbins, Minneapolis, MN (US)

(73) Assignee: Honeywell International Inc., Charlotte, NC (US)

( * ) Notice: Subject to any disclaimer, the term of this patent is extended or adjusted under 35 U.S.C. 154(b) by 241 days.

(21) Appl. No.: 18/053,535

(22) Filed: Nov. 8, 2022

(65) Prior Publication Data

US 2024/0345185 A1 Oct. 17, 2024

(51) Int. Cl.
*G01R 33/32* (2006.01)
*G01R 33/032* (2006.01)
(Continued)

(52) U.S. Cl.
CPC ........... *G01R 33/032* (2013.01); *G02F 1/395* (2013.01); *H01S 3/0912* (2013.01); *H01S 3/1083* (2013.01); *H01S 3/1086* (2013.01)

(58) Field of Classification Search
CPC .... G01R 33/60; G01R 33/26; G01R 33/0017; G01R 33/24; G01R 33/02; G01R 33/0206;
(Continued)

(56) References Cited

U.S. PATENT DOCUMENTS

| 6,594,300 B2 | 7/2003 | Wipiejewski |
| 7,043,117 B2 | 5/2006 | Matsko et al. |

(Continued)

FOREIGN PATENT DOCUMENTS

| CN | 104198967 A | 12/2014 |
| CN | 113568246 A | 10/2021 |

(Continued)

OTHER PUBLICATIONS

Hausmann et al., "An on-chip diamond optical parametric oscillator", arX1v:1309.1178v1, [physics.optics], Sep. 4, 2013, pp. 1 through 7.

(Continued)

*Primary Examiner* — Vinh P Nguyen
(74) *Attorney, Agent, or Firm* — Fogg & Powers LLC

(57) ABSTRACT

A photonics device for threshold magnetometry includes an absorbent material with nonlinear optical susceptibility, such as a diamond material with nitrogen vacancy defects, that is disposed in an optical resonator. The optical resonator receives light from an input source and includes nonlinear optical properties that enable the resonator to undergo a nonlinear photon generation process at a certain threshold power level to generate photons at distinct frequencies from the input light. The absorbent material absorbs photons entering the resonator when excited, which causes the threshold power level to shift as a function of the absorption. This may cause the optical resonator to stop generating photons via the nonlinear photon generation process and output a change in power. The change in power can be used to determine the characteristics of a present magnetic field.

20 Claims, 6 Drawing Sheets

(51) Int. Cl.
*G02F 1/39* (2006.01)
*H01S 3/091* (2006.01)
*H01S 3/108* (2006.01)

(58) Field of Classification Search
CPC .... G01R 23/02; G01R 29/08; G01R 33/3678; G01R 33/323; G01R 33/20; G01R 15/24; G01R 33/345; G01R 33/34; G01R 33/62; G01N 24/10; G01N 24/006; G01N 21/6489; G01N 2021/6495; G01N 33/54386; G01N 2223/646; G01N 23/227; G01N 21/636; G01N 27/82; G01N 27/83; G02F 2202/32; G02F 1/01708; G02F 1/365; G02F 1/225; G02F 3/00; G02F 3/024; G02F 1/011; G02F 1/095; G02F 1/335; G02F 1/395; G06F 3/046; G01D 5/35354; G01D 21/00; G01D 5/26; G01D 5/2451; G01D 5/30; H01S 3/0912; H01S 3/1083; H01S 3/1086

See application file for complete search history.

(56) References Cited

U.S. PATENT DOCUMENTS

| | | | |
|---|---|---|---|
| 7,266,258 B2 | 9/2007 | Liu et al. | |
| 8,138,756 B2 * | 3/2012 | Barclay | G01R 33/032 977/960 |
| 8,836,327 B2 | 9/2014 | French et al. | |
| 9,726,733 B2 | 8/2017 | Smith et al. | |
| 9,910,105 B2 | 3/2018 | Boesch et al. | |
| 10,042,009 B2 | 8/2018 | Lindorfer et al. | |
| 10,082,545 B2 | 9/2018 | Jeske et al. | |
| 10,114,083 B2 | 10/2018 | Forstner et al. | |
| 10,126,377 B2 | 11/2018 | Hahn et al. | |
| 10,317,279 B2 | 6/2019 | Bruce et al. | |
| 10,330,744 B2 | 6/2019 | Luzod | |
| 10,371,765 B2 | 8/2019 | Kaup et al. | |
| 10,571,269 B1 * | 2/2020 | Solmeyer | G01B 9/02 |
| 10,677,953 B2 | 6/2020 | Stetson et al. | |
| 10,901,054 B1 | 1/2021 | Chen et al. | |
| 10,928,200 B1 * | 2/2021 | Wu | H01S 3/094076 |
| 11,119,163 B2 | 9/2021 | Puckett et al. | |
| 11,131,619 B2 | 9/2021 | Ozdemir et al. | |
| 11,199,733 B2 | 12/2021 | Puckett et al. | |
| 11,300,639 B2 | 4/2022 | Solmeyer et al. | |
| 11,563,306 B2 | 1/2023 | Moench et al. | |
| 11,733,321 B2 | 8/2023 | Rosenfeld | |
| 2003/0185514 A1 | 10/2003 | Bendett et al. | |
| 2013/0265042 A1 | 10/2013 | Kawabata et al. | |
| 2014/0354275 A1 | 12/2014 | Sheng et al. | |
| 2016/0134078 A1 | 5/2016 | Gaeta et al. | |
| 2016/0231394 A1 | 8/2016 | Manickam et al. | |
| 2016/0356863 A1 | 12/2016 | Boesch et al. | |
| 2017/0023487 A1 | 1/2017 | Boesch | |
| 2017/0343621 A1 | 11/2017 | Hahn et al. | |
| 2018/0275210 A1 | 9/2018 | Luzod | |
| 2019/0018076 A1 | 1/2019 | Hahn et al. | |
| 2019/0018087 A1 | 1/2019 | Hahn et al. | |
| 2019/0219645 A1 | 7/2019 | Hahn et al. | |
| 2020/0018802 A1 | 1/2020 | Palacios Laloy et al. | |
| 2020/0192007 A1 | 6/2020 | Kwak et al. | |
| 2020/0403378 A1 | 12/2020 | Fujii et al. | |
| 2021/0103010 A1 | 4/2021 | Rosenfeld | |
| 2021/0103166 A1 | 4/2021 | Puckett et al. | |
| 2021/0132163 A1 | 5/2021 | Puckett et al. | |
| 2022/0121084 A1 | 4/2022 | Bowers et al. | |
| 2022/0128407 A1 | 4/2022 | Lee et al. | |
| 2022/0307997 A1 | 9/2022 | Meijer et al. | |
| 2022/0397429 A1 | 12/2022 | Burchard et al. | |
| 2023/0349989 A1 | 11/2023 | Burchard et al. | |

FOREIGN PATENT DOCUMENTS

| | | |
|---|---|---|
| DE | 102019203930 A1 | 9/2020 |
| DE | 102020004617 A1 | 1/2021 |
| EP | 3248021 A1 | 11/2017 |
| GB | 2408796 A | 6/2005 |
| JP | 6142025 B2 | 6/2017 |
| WO | 2007049260 A1 | 5/2007 |
| WO | 2019002576 A1 | 1/2019 |

OTHER PUBLICATIONS

Jensen et al., "Cavity-Enhanced Room-Temperature Magnetometry Using Absorption by Nitrogen-Vacancy Centers in Diamond", Physical Review Letters, Apr. 23, 2014, vol. 112, Issue 16, pp. 160802-1 through 160802-5, (c) 2014 American Physical Society.

Bougas et al., "On the Possibility of Miniature Diamond-Based Magnetometers Using Waveguide Geometries", Micromachines 2018, 9, 276, Jun. 1, 2018, pp. 1 through 11, MDPI.

Dumeige, et al., "Infrared laser threshold magnetometry with a NV doped diamond intracavity etalon", Optics Express, vol. 27, No. 2, Jan. 21, 2019, pp. 1706 through 1717.

Jensen et al., "Cavity-Enhanced Room Temperature Magnetometry Using Absorption by Nitrogen-Vacancy Centers in Diamond", Physical Review Letters, PRL, 112, 160802, Week ending Apr. 25, 2014, pp. 160802-1 through 160802-5.

Knauer et al., "Structured Polymer Waveguides on Distributed Bragg Reflector Coupling to Solid State Emitter", Journal of Optics 19(6), [065203]. 2017, https://doi.org/10.1088/2040/8986/aa6a70, Page(s) Cover pages through 9.

Sergaeva, et al., Resonant Dielectric Waveguide-Based Nanostructure for Efficient Interation With Color Centers in Nanodiamonds, Nanosystems: Physics, Chemistry, Mathematics, 2019, 10 (3), PACS 42.25.Fx, 42.79.e, 42.82 Gw, DOI 10.17586/2220-8054-2019-10-3-266-272, pp. 266-272.

U.S. Patent and Trademark Office, "Corrected Notice of Allowability", U.S. Appl. No. 16/786,495, May 14, 2021, pp. 1 through 6, Published: US.

U.S. Patent and Trademark Office, "Notice of Allowance", U.S. Appl. No. 16/786,495, Apr. 30, 2021, pp. 1 through 18, Published: US.

U.S. Patent and Trademark Office, "Notice of Allowance", U.S. Appl. No. 16/788,819, Aug. 18, 2021, pp. 1 through 9, Published: US.

U.S. Patent and Trademark Office, "Notice of Allowance", U.S. Appl. No. 17/027,450, Dec. 3, 2021, pp. 1 through 13, Published: US.

U.S. Patent and Trademark Office, "Office Action", U.S. Appl. No. 16/788,819, Apr. 13, 2021, pp. 1 through 10, Published: US.

Wu et al., "Coupled Cavity Magnetometer", U.S. Appl. No. 18/165,891, filed Feb. 7, 2023, pp. 1 through 27.

* cited by examiner

INTEGRATED PHOTONICS MAGNETOMETER BASED ON A NONLINEAR DIAMOND-CONTAINING RESONATOR

STATEMENT REGARDING FEDERALLY SPONSORED RESEARCH OR DEVELOPMENT

This invention was made with Government support under FA8650-20-C-7034 awarded by Air Force Research Laboratory—Wright Research. The Government has certain rights in the invention.

BACKGROUND

Many applications use precise measurements of magnetic fields. In particular, applications attempt to measure vector magnetic fields to provide desired functionality within a system. For example, applications may measure magnetic fields in anomaly-based navigation and in dipole beacon-based navigation. These applications typically require magnetic sensors with high sensitivity; low size, weight, and power; and the ability to operate in an earth field. Some technologies (i.e., SQUID devices, atomic based magnetometry) are capable of providing high sensitivity that is useful in certain applications. However, some of these technologies have drawbacks. For example, SQUID uses cryogenic refrigeration, which adds to the size and power consumption of the magnetometer. Moreover, atomic based magnetometers are unable to operate in an earth field. Further, these technologies use at least three sensors to provide vector information.

SUMMARY

The details of one or more embodiments are set forth in the following description. The features illustrated or described in connection with one exemplary embodiment may be combined with the features of other embodiments. Thus, any of the various embodiments described herein can be combined to provide further embodiments. Aspects of the embodiments can be modified, if necessary to employ concepts of the various patent, applications, and publications as identified herein to provide yet further embodiments.

In one embodiment, a device is disclosed. The device comprises a substrate. The device comprises at least one optical pathway disposed on the substrate and configured to receive light having a first frequency. The device comprises a first optical resonator having nonlinear photon generation properties coupled to the at least one optical pathway. The first optical resonator is configured to increase an intensity of the light having the first frequency. When the intensity of the light having the first frequency exceeds a first threshold power level, the first optical resonator undergoes a nonlinear photon generation process to generate photons at a second frequency different from the first frequency. The at least one optical pathway is configured to couple the light having the second frequency out of the first optical resonator at an output power level and to couple the light having the second frequency out of the substrate. The device comprises an absorbent material disposed in the first optical resonator. The absorbent material is configured, in response to being excited by light having a third frequency that corresponds to an excitation frequency of the absorbent material, to absorb the light having the first frequency. The absorbent material has a nonlinear optical susceptibility such that, by absorbing the light having the first frequency, the absorbent material is configured to adjust a threshold power level needed for the first optical resonator to undergo the nonlinear photon generation process from the first threshold power level to a second threshold power level higher than the first threshold power level. When the intensity of the light having the first frequency is below the second threshold power level, the first optical resonator is not able to generate light having the second frequency. The output power level of the light having the second frequency that is coupled out of the first optical resonator decreases in response to the intensity of the light having the first frequency being below the second threshold power level.

In another embodiment, a system is disclosed. The system comprises a first laser configured to transmit light at a first frequency. The system comprises a photonics circuit coupled to the first laser. The photonics circuit comprises a substrate. The photonics circuit comprises at least one optical pathway disposed on the substrate and configured to receive the light at the first frequency. The photonics circuit comprises a first optical resonator having nonlinear photon generation properties coupled to the at least one optical pathway. The first optical resonator is configured to increase an intensity of the light at the first frequency. When the intensity of the light at the first frequency exceeds a first threshold power level, the first optical resonator undergoes a nonlinear photon generation process to generate photons at a second frequency different from the first frequency. The at least one optical pathway is configured to couple the light having the second frequency out of the first optical resonator at an output power level and to couple the light having the second frequency out of the substrate. The photonics circuit comprises an absorbent material disposed in the first optical resonator. The absorbent material is configured, in response to being excited by light having a third frequency that corresponds to an excitation frequency of the absorbent material, to absorb the light having the first frequency. The absorbent material has a nonlinear optical susceptibility such that, by absorbing the light having the first frequency, the absorbent material is configured to adjust a threshold power level needed for the first optical resonator to undergo the nonlinear photon generation process from the first threshold power level to a second threshold power level higher than the first threshold power level. When the intensity of the light having the first frequency is below the second threshold power level, the first optical resonator is not able to generate light having the second frequency. The system comprises a detector coupled to the at least one optical pathway and configured to detect the light having the second frequency at the output power level. The system comprises an electromagnetic transmitter coupled to the absorbent material. The electromagnetic transmitter is configured to transmit a frequency-varied electromagnetic wave to the absorbent material that varies over a frequency range. The system comprises at least one processor coupled to the detector. The at least one processor is configured to determine a characteristic of a magnetic field in response to a change in the output power level.

In yet another embodiment, a method is disclosed. The method comprises receiving, at a first optical resonator, light having a first frequency. The method comprises generating, by the first optical resonator, light having a second frequency in response to an intensity of the light having the first frequency exceeding a first threshold power level. The method comprises absorbing, by an absorbent material disposed in the first optical resonator, the light having the first frequency in response to receiving light having a third frequency that corresponds to an excitation frequency of the absorbent material. The absorbent material has a nonlinear optical susceptibility such that, by absorbing the light having the first frequency, the absorbent material is configured to adjust a threshold power level needed for the first optical resonator to generate light having the second frequency from the first threshold power level to a second threshold power level higher than the first threshold power level. The method comprises detecting a change in output power level of the first optical resonator in response to the light at the first frequency being absorbed. The method comprises determining a characteristic of a magnetic field in response to the change in output power.

BRIEF DESCRIPTION OF THE DRAWINGS

Understanding that the drawings depict only exemplary embodiments and are not therefore to be considered limiting in scope, the exemplary embodiments will be described with additional specificity and detail through the use of the accompanying drawings, which are briefly described as follows and further described in the detailed description.

Figure 1:
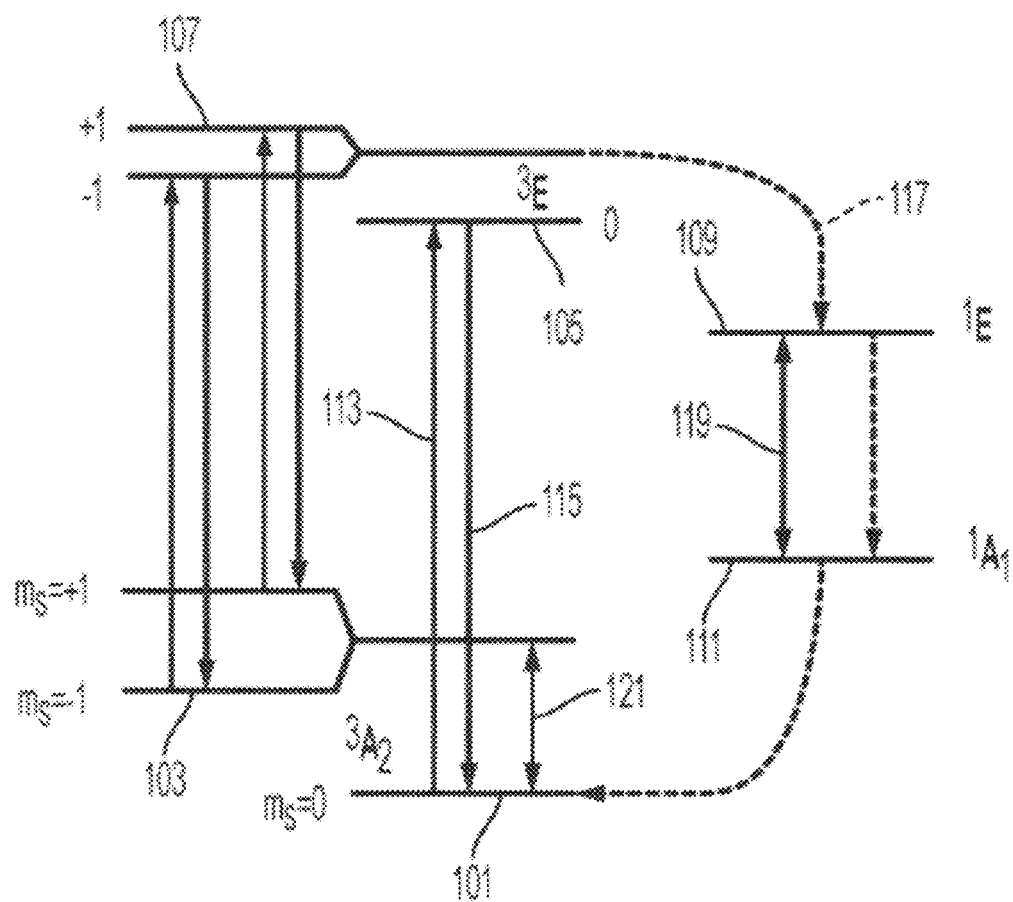
FIG. 1 depicts a diagram illustrating transitions between the various states of an absorbent material used for fabricating a magnetometer.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Systems and methods for magnetometry are presented comprising an absorbent material in an optical resonator of a photonics circuit. In exemplary embodiments, the absorbent material is a diamond-based nonlinear waveguide with nitrogen vacancy centers. The absorbent material can absorb photons propagating within an optical resonator at a resonant frequency, thereby reducing the output power level of the optical resonator. The absorption rate of the absorbent material can be modified based on a range of frequencies emitted by a transmitter. Based on the frequency at which the photons in the optical resonator are absorbed, one or more characteristics of a magnetic field can be determined. By including an absorbent material in the optical resonator and measuring the output power, the magnetometer can determine characteristics of a magnetic field without the requirements for high coupling efficiency required for other applications.

FIG. 1 is a diagram illustrating transitions between the various states of a particular material used for fabricating a magnetometer. For example, some absorbent materials may have certain physical characteristics that allow the material to be responsive to magnetic fields. The absorbent material may be a nitrogen vacancy (NV) diamond, silicon carbide with defect centers, or other material having similar physical characteristics. As used herein, NV diamond refers to a diamond-based material having multiple point defects where a point defect includes a nearest-neighbor pair of a nitrogen atom substituted for another atom (say, a carbon atom) and a lattice vacancy.

As illustrated, the absorbent material may have a ground state that is a spin triplet state. The ground state may have multiple spin projections: a ground antiparallel 101 of spin projection 0 and ground parallel spins 103 with spin projections of +/−1, where the ground antiparallel spins 101 and the ground parallel spins 103 are separated by a resonant frequency 121. In the absence of a magnetic field, when the absorbent material is NV diamond, the resonant frequency may be equal to 2.87 GHz. Additionally, the point defects within the first material may be optically excited through spin conserving transitions to a spin triplet excited level, where the triplet excited level also has multiple spin projections: an excited antiparallel spin 105 of spin projection 0 and excited parallel spins 107 with spin projections of +/−1. To optically excite the point defects, the absorbent material may be exposed to a pump light having a particular frequency. For example, in NV diamond, laser light having a wavelength of 532 nm may cause spin conserving transitions from the ground triplet state to the excited triplet states.

When the point defects within the absorbent material are at the excited state, the defects may relax either through a radiative transition 115 or through an intersystem crossing 117. When the point defect relaxes through a radiative transition 115, the point defects may fluoresce and return to the ground triplet states. For example, NV diamond point defects generally emit light having a wavelength of 637 nm during radiative transitions 115. When the point defect relaxes through an intersystem crossing 117, the point defect will not fluoresce and will transition to a shelved state, where the shelved state is a shelved ground state 111 or a shelved excited state 109. Additionally, when the point defects are in one of the shelved states 109 and 111, the point defects absorb probe laser light 119 having a particular frequency. For example, NV diamond point defects in the shelved states 109 and 111 absorb probe laser light 119 having a wavelength of 1042 nm.

In some implementations, a microwave frequency is applied to the absorbent material to increase the rate of intersystem crossings 117 as compared to radiative transitions 115. In the absorbent material, non-radiative intersystem crossings 117 may be strongly spin selective. For example, point defects having a parallel spin 107 are more likely to experience an intersystem crossing 117 to the shelved states 109 and 111. In contrast, point defects having the excited antiparallel spin 105 are more likely to experience a radiative transition back to the ground triplet state. To increase the probability of intersystem crossings, a microwave frequency is applied to the absorbent material that is equal to the resonant frequency for the absorbent material. For example, when the absorbent material is NV diamond, the resonant frequency may be 2.87 GHz. In this implementation, applying a radio frequency of 2.87 GHz to the first material will increase the probability of intersystem crossings 117 to the shelved states 109 and 111.

Additionally, when a microwave signal at the resonant frequency is applied to the first material, the probe laser light 119 is more likely to be absorbed by the first material as the population of point defects at the shelved states 109 and 111 within the first material is greater than when the first material is not exposed to the RF energy at the resonant frequency. Accordingly, when the probe laser light 119 is applied to the first material in the absence of the microwave signal at the resonant frequency, the probe laser light 119 is absorbed by the absorbent material with less frequency. For example, when NV diamond material is exposed to a microwave signal having a resonant frequency of 2.87 GHz, the NV diamond material begins to absorb probe laser light 119 having a wavelength of 1042 nm at an increased rate.

In some implementations, the resonant frequency for the first material changes in the presence of a magnetic field. For example, when the first material is exposed to a magnetic field, the Zeeman effect causes the resonant frequency to experience a shift in proportion to the strength of the experienced magnetic field. In the presence of a magnetic field, the resonance frequency splits into two different resonant frequencies, where the difference between the two resonant frequencies is proportional to the experienced magnetic field. Accordingly, the resonant frequency at which a probe laser light 119 is absorbed by point defects in the absorbent material can be monitored to determine the strength of a magnetic field experienced by the absorbent material.

Additionally, the point defects within the first material can be in one of multiple different orientations. For example, when the first material is NV diamond, each point defect can be in one of four different orientations. The absorbent material can have many point defects in each of the four different orientations. Accordingly, vector information for a magnetic field is extracted from the first material when a probe laser light 119 is applied to the absorbent material. For example, when the absorbent material is exposed to a magnetic field, the resonant frequencies for a point defect shift based on the orientation of the point defect in relation to the experienced magnetic field. When the point defects in the absorbent material are in multiple different orientations, the point defects in the absorbent material have separate resonant frequencies associated with each of the different orientations of the point defects. Therefore, vector information for the magnetic field is determined by identifying which resonances correspond to the different orientations of the point defects in the absorbent material. In some implementations, biased magnetic fields are applied to the absorbent material to aid in determining which resonance frequencies are associated with particular orientations of the point defects.

In the examples described herein, the absorbent material is incorporated within a magnetometer that exposes the absorbent material to a pump light 113 to cause the point defects within the absorbent material to move to the excited triplet state. The magnetometer may also expose the absorbent material to RF energy in a range of frequencies that includes the resonant frequency 121 for the absorbent material, where a probability of intersystem crossings 117 to shelved states 109 and 111 increases at the resonant frequency 121 as described above. Additionally, the absorbent material is exposed to a probe laser light 119, where the probe laser light 119 is absorbed by point defects in the shelved states 109 and 111. Accordingly, an applied microwave signal is swept through a range of frequencies to identify the resonant frequencies associated with the different orientations of the point defects within the absorbent material. The resonant frequencies may be identified when the intensity of the applied probe laser light 119 that passes through the absorbent material decreases, indicating that the applied probe laser light 119 was absorbed by the point defects within the first material. Based on the identified resonant frequencies, a magnetic field experienced by the absorbent material may be calculated with high sensitivity to magnetic field changes; low size, weight, and power; and a robustness that could enable the use of a resulting magnetometer in many magnetic based/aided applications such as in navigation.

Figure 2:
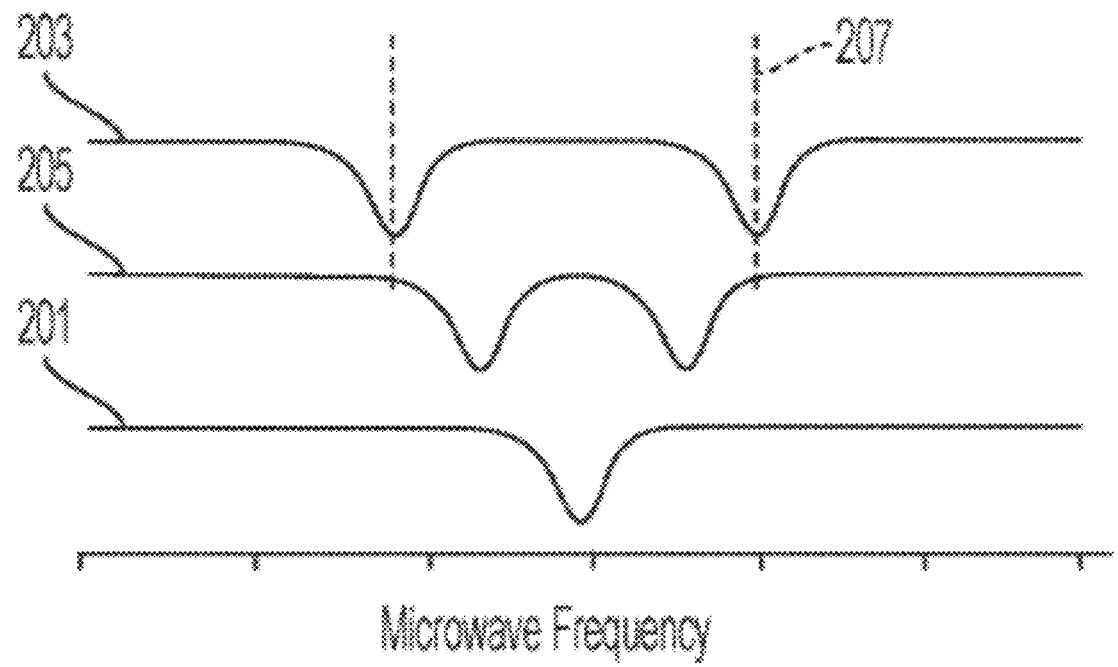
FIG. 2 depicts a graph illustrating the detection of a magnetic field based on the identification of resonance lines in an applied microwave field.

FIG. 2 is a graph illustrating the detection of a magnetic field based on the identification of resonance lines in an applied microwave field that is swept through a range of frequencies. As previously described, an absorbent material may be exposed to a range of microwave frequencies, where the range of applied frequencies includes the different resonant frequencies for the first material. Additionally, the different resonant frequencies are associated with the strength of the magnetic fields experienced by the absorbent material. The absorbent material may also have different resonant frequencies associated with the different orientations of point defects within the absorbent material.

As illustrated, FIG. 2 shows various graphs of the intensity of a probe laser as emitted from the absorbent material at different microwave frequencies applied to the absorbent material for three different magnetic field strengths. For example, graph 201 shows the intensity of the emitted probe laser at different frequencies when the absorbent material is not exposed to a magnetic field. When light from a probe laser is coupled into the absorbent material in the absence of an applied magnetic field, the absorbent material will not experience a Zeeman shift and the probe laser light will be absorbed at the single resonant frequency for the absorbent material. Accordingly, the intensity of the light 201 may decrease at the single resonant frequency for the absorbent material.

But when the absorbent material is exposed to different magnetic field strengths, the resonant frequency may experience a frequency shift in proportion to the experienced magnetic field strength. For example, graph 205 and graph 203 illustrate an intensity of the emitted probe laser light by the absorbent material in the presence of different magnetic field strengths. For example, the magnetic field strength experienced by the absorbent material associated with the graph 203 is greater that the magnetic field strength experienced by the absorbent material described by the graph 205. Accordingly, the magnitude of the shift of the resonant frequencies is greater when the absorbent material is exposed to a greater magnetic field strength. To identify the magnitude of the shift of the resonant frequency, a system identifies the frequencies 207 associated with decreases in the intensity of the probe laser light emitted by the absorbent material. Based on the magnitude of the shift of the resonant frequency, a system determines the magnetic field experienced by a point defect. Additionally, when there are multiple resonant frequencies, the system may identify the orientations of the point defects associated with the different resonant frequencies and the direction of the experienced magnetic field.

Figure 3:
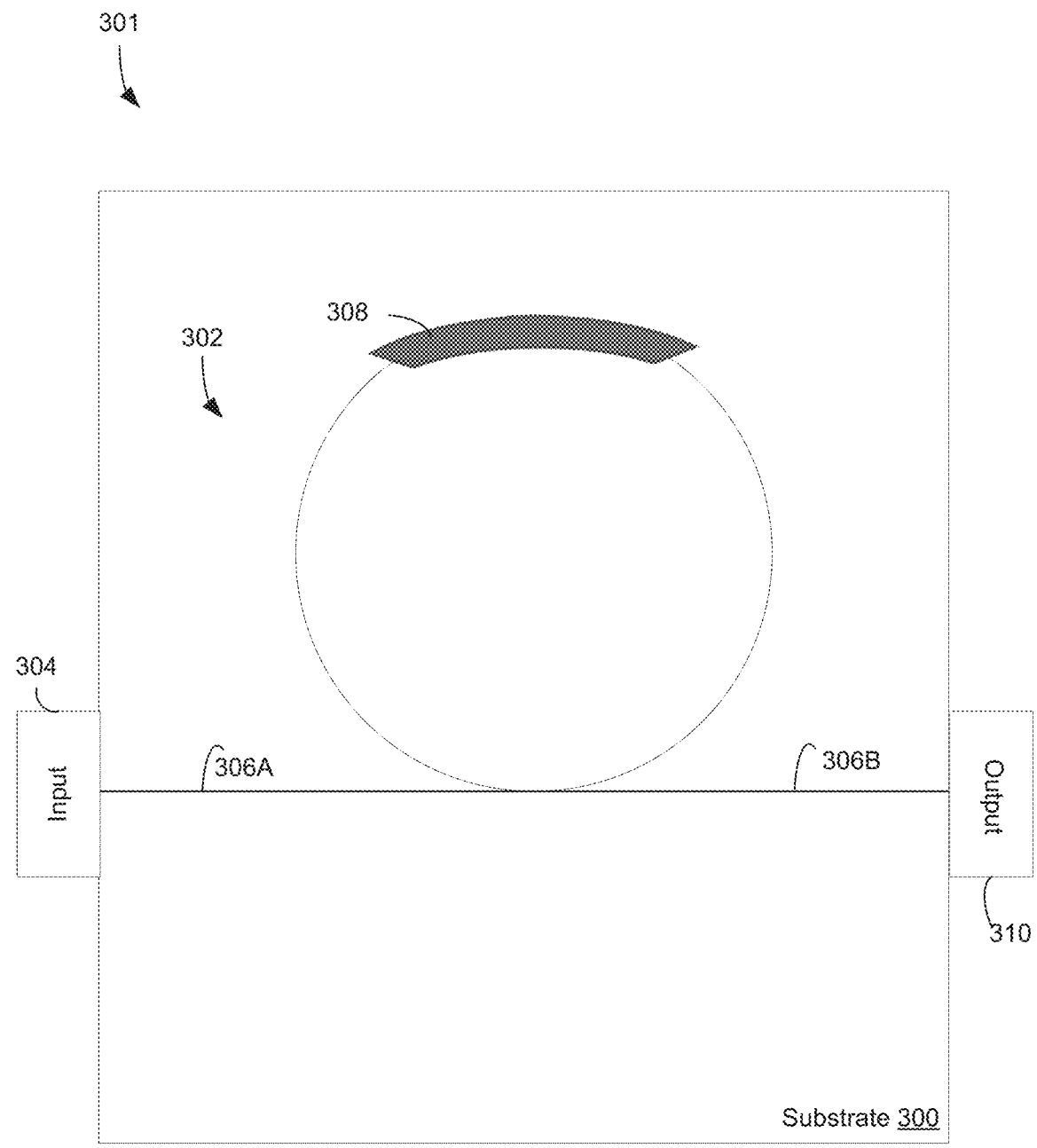
FIG. 3 depicts a diagram illustrating a system comprising a diamond-based material disposed in an optical resonator that absorbs light from a pump laser.

FIG. 3 depicts a diagram illustrating a system 301 comprising a diamond-based absorbent material disposed in an optical resonator that absorbs light from a laser. The system includes a substrate 300, which may be physically or electrically coupled to other substrates not explicitly shown in FIG. 3. In various embodiments, substrate 300 is implemented as an integrated photonics chip with a suitable material. Optically coupled to substrate 300 is an input light source 304 and an output 310, which are coupled in substrate 300 by optical pathways 306A, 306B.

Input light source 304 is configured to generate and provide light at a wavelength or frequency to the optical pathway 306. Input light source 304 is, for example, a laser configured to generate photons at a wavelength of 1042 nm, though other light sources and other wavelengths can be used. Optical pathway 306A is configured to receive the light generated from input light source 304. In some embodiments, optical pathway 306 includes one or more optical waveguides disposed in substrate 300. Additionally, or alternatively, optical pathway 306 includes free space optics such as mirrors, beamsplitters, or optical couplers.

Optical pathway 306A is coupled to an optical resonator 302 and is configured to couple the light generated from input light source 304 into optical resonator 302. Optical resonator 302 acts as a gain medium for the input light and can be embodied as an optical parametric oscillator. The optical resonator 302 generally operates to build-up the power level of the input light so that the intensity of the light at the frequency of the input light source 304 increases as the light propagates in the optical resonator 302.

The optical resonator 302 also includes nonlinear optical properties that may depend on the intensity of the light. In some embodiments, when the intensity of the light increases above a threshold power level, the high intensity of light triggers the nonlinear optical properties of the optical resonator 302 and causes the optical resonator 302 to undergo a nonlinear photon generation process to generate photons at a frequency different than the frequency of the input light source 304. Various nonlinear photon generation processes can be used, such as stimulated Brillouin scattering (SBS), optical frequency comb formation, or others, to excite the photons from input light source 304. Each nonlinear photon generation process may correlate with a different threshold power level that triggers the desired nonlinear properties of the optical resonator 302. In the case of SBS, a single additional wavelength greater than that of the probe will be produced, and in the case of optical frequency comb generation, many periodically spaced wavelengths will be produced. So long as the intensity of the light remains at the threshold power level, optical resonator 302 continues to generate photons at a frequency different than the frequency of the input light. This enhanced sensitivity of the optical resonator 302 above the threshold power level can be used to derive information about a magnetic field experienced by the system 301.

System 301, and optical resonator 302 more specifically, includes an absorbent material 308. During the process of increasing the intensity of the light the absorbent material 308 may not be excited and in a non-excited state will not impede the intensity increase of light in the optical resonator 302. Similarly, when the intensity increases above the threshold power level and optical resonator 302 generates photons at a different frequency, absorbent material 308 may not be in an excited state and will not impede the generation of photons during the nonlinear photon generation process. So long as absorbent material 308 is not excited, the input light photons will build up to a larger intensity inside the resonator to a maximum value, and the threshold for the nonlinear effect under consideration will be reached, producing light at one or more wavelengths that are distinct from the probe. The generated light from the nonlinear photon generation process can then exit the optical resonator 302 and couple to optical pathway 306B, where it can be provided to output 310.

The absorbent material 308 possesses nonlinear optical characteristics, such as a nonlinear optical susceptibility, that trigger upon exciting the absorbent material 308 to an excited state. More specifically, when the absorbent material 308 becomes excited, it absorbs the photons in the resonator of the wavelength or frequency generated by input light source 304. As a result, the amount of photons at the frequency of the input light source 304 decrease, which causes the intensity of the photons at the frequency of the light source to decrease. Accordingly, when in an excited state, the output power generated by the optical resonator 302 decreases relative to the output power that would be generated if the absorbent material 308 is configured in an unexcited state (e.g., ground state), due to the absorption of photons. The decrease in intensity may cause the optical resonator 302 to generate different photons via the nonlinear photon generation process at a decreased rate. As the absorbent material 308 continues to absorb photons, the intensity of the light may decrease to a level that falls below the threshold power level needed for the optical resonator 302 to undergo the nonlinear photon generation process. In doing so, the optical resonator 302 can no longer generate photons at a different frequency from the input light from source 304, and so the power level of light at the different frequency will rapidly decrease.

Stated another way, in the context of nonlinear properties of the optical resonator 302, the increased absorption can cause the optical resonator 302 to stop generating photons while undergoing the nonlinear photon generation process by increasing the effective threshold power needed for the nonlinear photon generation process to occur. Where ordinarily the threshold power level for triggering the nonlinear optical properties of optical resonator 302 would be at a first threshold level, the excitation of absorbent material 308, and the subsequent absorption of photons thereof, changes the effective threshold level to a second threshold level that is higher than the first threshold level. If the intensity of the light at the frequency of the input light source 304 is lower than the second threshold level, the optical resonator 302 will not undergo the nonlinear photon generation process and no photons will be generated at the different frequency. This will cause the corresponding output signal to decrease rapidly, and perhaps even vanish, at output 310. The change in output power caused by the excitation of the absorbent material 308 and variation of the effective threshold level needed to undergo the nonlinear photon generation process can be compared with an output power level when the absorbent material 308 is not excited. As described further with respect to FIG. 5, a frequency-varying electromagnetic field can be applied to absorbent material 308 to monitor the level of absorption of photons by the input light source 304 by observing the output power of the optical resonator 302. As the frequencies of the electromagnetic field vary over the absorbent material 308, the output power of the optical resonator 302 will change accordingly. The frequenc(ies) at which the absorbent material 308 absorbs photons can then be used to determine characteristics of a magnetic field experienced by a magnetometer sensor including the system implemented on substrate 300.

For example, assuming the absorbent material 308 is a diamond-based material with nitrogen vacancy point defects, a frequency-varying electromagnetic field applied to the NV diamond in an excited state will cause the NV diamond material to absorb photons at different absorption rates depending on the frequency of the electromagnetic field, thereby causing the output power level of optical resonator 302 to change in response as a result of the change of the effective threshold needed to undergo the nonlinear photon generation process.

In one embodiment, output 310 includes a photodetector configured to receive the optical signal corresponding to the output power of the optical resonator 302 and to convert the optical signal to an electrical signal. Output 310 then provides the electrical signal to a processor to determine the characteristics of the magnetic field (if any) applied to the absorbent material 308, as described in conjunction with FIGS. 4-5. However, the output power of the optical resonator 302 can be used to determine other characteristics as well.

Utilizing the non-linear characteristics of the diamond region 308 in the optical resonator 302, rather than coupling to a separate non-linear device such as a laser, alleviates the strict coupling constraints on the propagation of pump light to the absorbent material 308. Photonics devices, generally and specifically for diamond-based threshold magnetometers, require near perfect coupling between the excitation source (e.g., the pump laser) and the absorbent material to obtain the sensitivity needed for accurate measurements. Unprecise coupling generally introduces undesirable biases that hinder device quality. The structure of the apparatus described in FIG. 3 and the additional embodiments can obtain accurate measurements without the costly requirements for high coupling constraints. In fact, such embodiments enable the pump laser to be relatively decoupled from the absorbent material by implementing the pump laser on a separate substrate, which cannot be obtained by conventional threshold magnetometers, including the devices previously referenced.

Figure 4:
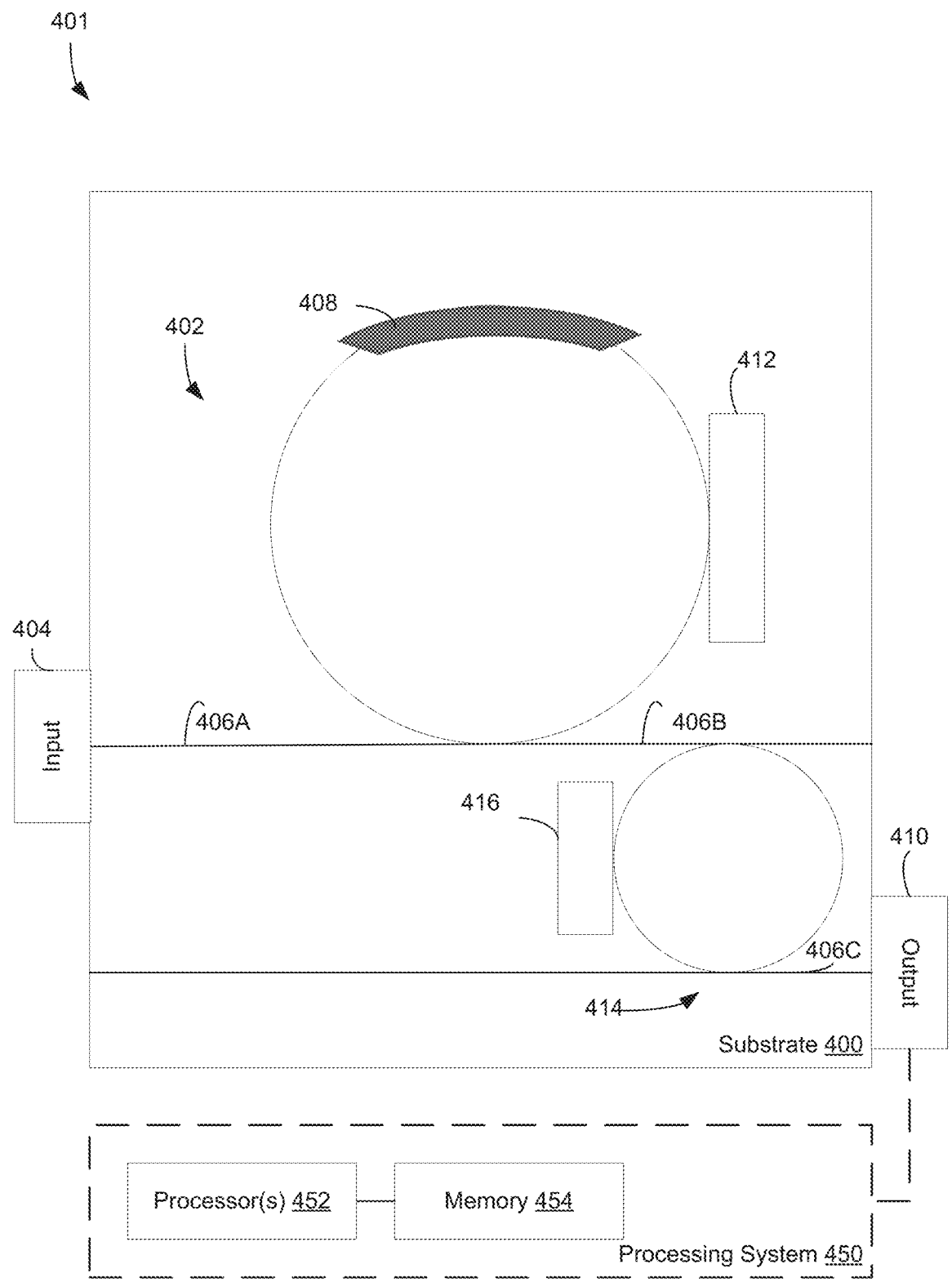
FIG. 4 depicts a diagram illustrating a system comprising a secondary optical resonator and heater elements coupled to a primary optical resonator that comprises a diamond-based material disposed in the primary optical resonator.

For example, one embodiment of a system 401 configured as a magnetometer is depicted in FIG. 4. The input light source 404, optical pathway 406A, 406B, absorbent material 408, and output 410 function similarly as described with respect to FIG. 3. In this embodiment, substrate 400 includes both a primary optical resonator 402 and a secondary optical resonator 414. Primary optical resonator 402 is configured to function similarly to optical resonator 302 of FIG. 3. That is, primary optical resonator 402 receives the input light at a frequency from optical pathway 406A and increases the intensity of the light at that frequency. When the intensity of the light exceeds a threshold power level set based on the nonlinear properties of the optical resonator, the optical resonator 402 is configured to undergo a nonlinear photon generation process to generate photons at a different frequency. Upon exciting absorbent material 408, the output power of the light at the frequency may decrease because the absorbent material 408 absorbs photons at the frequency generated by the input light source 404, which causes a shift in the effective threshold power level needed to undergo the nonlinear photon generation process higher than the intensity of the light. When the intensity of the light is below the higher effective threshold level, the nonlinear properties of optical resonator 402 can no longer be used to generate photons at the different frequency and the resulting output power provided to output 410 markedly decreases.

Secondary optical resonator 414 is configured to receive the output photons coupled from primary optical resonator 402 into optical pathway 406B. Secondary optical resonator 414 acts as a filter resonator to primary optical resonator 402. When the output light from primary optical resonator 402 couples into secondary optical resonator 414 from optical pathway 406B, the output light resonates at the frequency of the light generated from the nonlinear photon generation process, while light that does not propagate at this frequency is not intensified by secondary optical resonator 414. In doing so, only the light at the frequency matching the frequency of the photons from the nonlinear photon generation process is filtered through the secondary optical resonator 414, and any anomalous frequencies (e.g., frequency changes due to light passing through absorbent material 408 or light at the frequency of the input source 404) become negligible once filtered by secondary optical resonator 414. After being filtered by secondary optical resonator 414, the light is provided to optical pathway 406C and subsequently to output 410.

Primary optical resonator 402 and secondary optical resonator 414 also include one or more heating elements 412, 416. The heating elements 412, 416 can be implemented as microheaters or piezo-electric regions, for example, that are disposed in the resonator path. Heating elements 412, 416 are configured to adjust the effective optical path length of one or more portions of the resonator path (specifically, heating element 412 adjusts a portion of the primary optical resonator 402 optical path length and heating element 416 adjusts a portion of the secondary optical resonator 414 optical path length). Doing so provides an additional (and optional) mechanism for tuning the resonance frequency of the primary optical resonator 402 or secondary optical resonator 414 to filter out optical aberrations or biases introduced by sub-optimal coupling of the optical components on substrate 400. Although not explicitly shown in FIG. 4, each resonator can include multiple heating elements disposed anywhere along the resonator path.

In one embodiment, output 410 provides the output power level to an optional processing system 450 comprising at least one processor 452 coupled to a memory 454. Processor 452 and the other processing systems described herein may include any one or combination of processors, microprocessors, digital signal processors, application specific integrated circuits, field programmable gate arrays, or other similar variants thereof. Processor 452 and the other processing systems described herein may also include, or function with, software programs, firmware, or other computer readable instructions for carrying out various process tasks, calculations, and control functions, used in the methods further described. These instructions are typically tangibly embodied on any program product comprising storage media (or computer readable media) used for storage of computer readable instructions or data structures, embodied in FIG. 4 as memory 454.

Memory 454 can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network or a wireless link.

In one embodiment, the output 410 comprises a photodetector that converts the output optical signal representative of the output power from primary optical resonator 402 and converts the optical signal into an electrical signal, which is fed into processing system 450. Processor 452 is configured to determine the characteristics of the magnetic field applied to the absorbent material 408 or other parameter from the output power signal. For example, processor 452 may determine the magnetic field components as a function of the variation of the output power signal that corresponds to the shift in the threshold power level caused by the absorption of photons from absorbent material 408.

Figure 5:
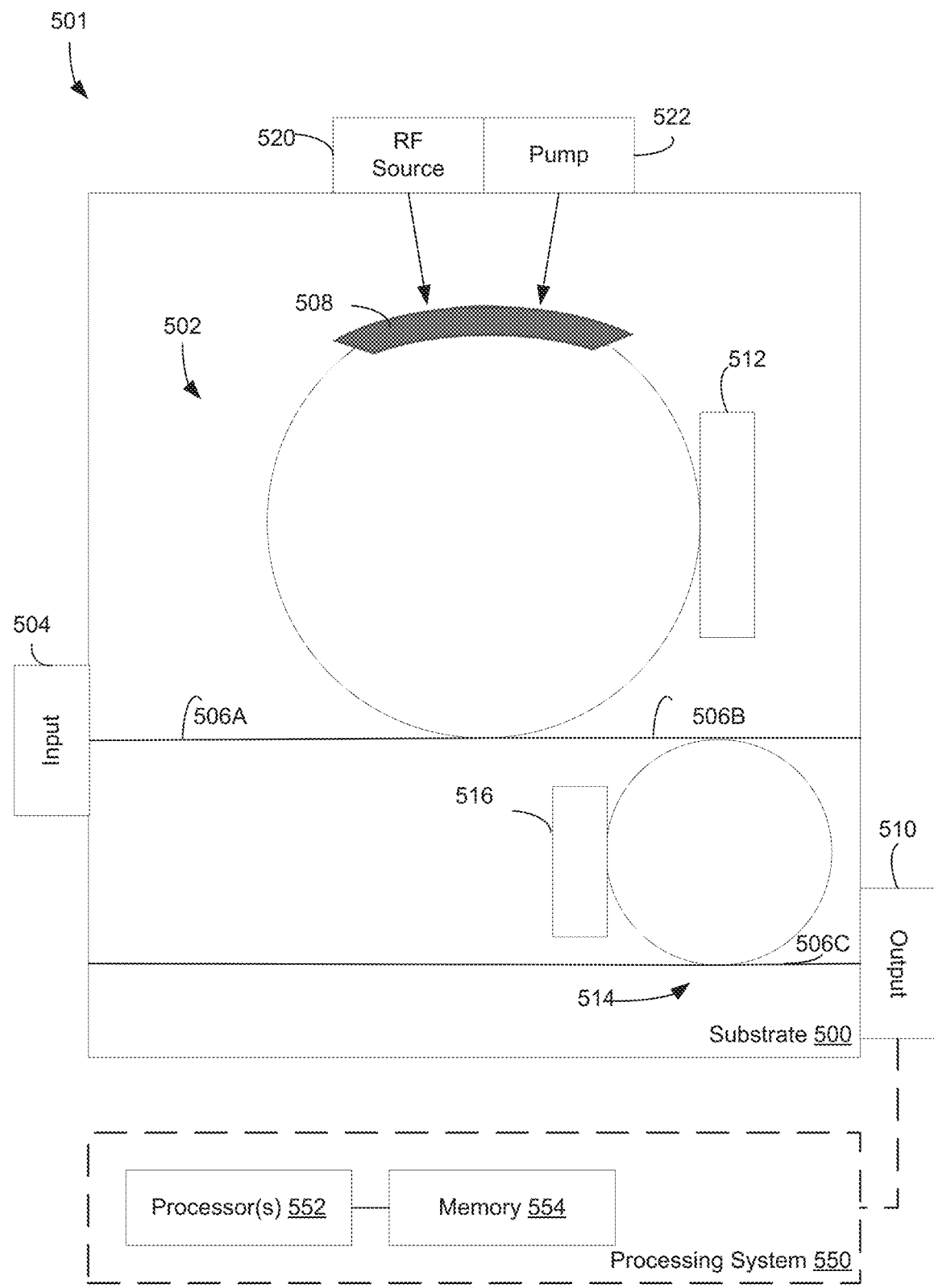
FIG. 5 depicts a diagram illustrating a system comprising an electromagnetic transmitter and a pump laser coupled to the diamond-based material of the optical resonator of FIGS. 3-4.

FIG. 5 depicts a diagram illustrating a system 501 comprising an electromagnetic transmitter and a pump laser coupled to the absorbent material of the optical resonator of FIGS. 3-4. The components illustrated in FIG. 5 function similarly to those described in FIGS. 3-4, including input 504, primary optical resonator 502, secondary optical resonator 514, absorbent material 508, heating elements 512, 516, optical pathway 506A, 506B, 506C, output 510. Processing system 550 analyzes the signal indicative of output power from primary optical resonator 502 using processor 552 and memory 554 similarly as described in FIG. 4.

Additionally, substrate 500 is coupled to an RF source 520 and a pump laser 522. One or both of the RF source 520 and the pump laser 522 can be indirectly coupled to the substrate 500 and by extension, to absorbent material 508. Pump laser 522 is configured to radiate light at a pump light frequency to the absorbent material 508, which excites the absorbent material 408 to substantially absorb photons at the wavelength of input light source 404. For example, in one embodiment the pump laser 522 is configured to generate a pump light of 532 nm. While pump laser 522 excites the absorbent material 508, RF source 520 is configured to apply a variable electromagnetic field to the absorbent material 508. For example, the electromagnetic field emitted by RF source 520 can have a frequency in the microwave or radio range of the electromagnetic spectrum. In one example, the RF source 520 is configured to scan through a range of RF or microwave frequencies.

As the electromagnetic field emitted by the RF source 520 varies in frequency, the output power of the primary optical resonator 502 may also vary accordingly. For example, as the frequency of the electromagnetic field emitted by the RF source 520 changes within the frequency range, the output power of the optical resonator may noticeably decrease at one or more of the frequencies in the frequency range The sudden decrease in output power corresponds to the absorption of photons by the absorbent material 508 such that optical resonator 502 is no longer able to generate photons via the nonlinear photon generation process. The emitted frequency at which the output power level decreases can be used to determine one or more parameters of a magnetic field that is experienced by system 501.

Figure 6:
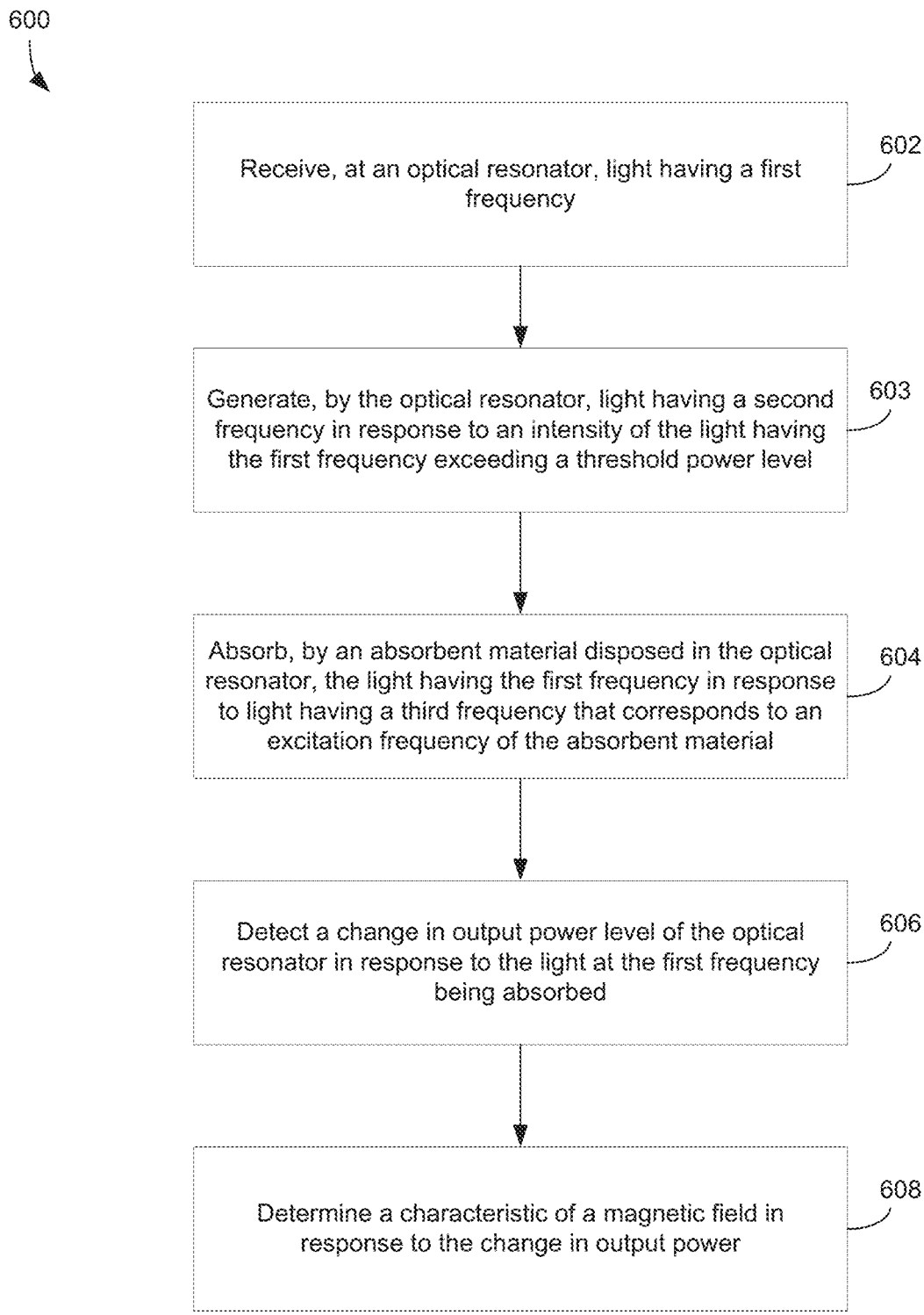
FIG. 6 depicts a flow diagram illustrating a method for detecting magnetic field characteristics.

FIG. 6 depicts a flow diagram illustrating a method 600 for detecting magnetic characteristics of magnetic fields, which can be implemented using the systems described in conjunction with FIGS. 1-5. The blocks of the flow diagram have been arranged in a generally sequential manner for ease of explanation; however, it is to be understood that this arrangement is merely exemplary, and it should be recognized that the processing associated with the methods described herein (and the blocks shown in the Figures) may occur in a different order (for example, where at least some of the processing associated with the blocks is performed in parallel and/or in an event-driven manner). Also, most standard exception handling is not described for ease of explanation; however, it is to be understood that method 600 can and typically would include such exception handling.

Method 600 includes receiving light having a first frequency at an optical resonator, e.g., the optical resonator 302 or the primary optical resonators 402, 502 at block 602. The optical resonator includes a circular configuration of waveguides with nonlinear optical properties disposed (e.g., embedded) in a photonics substrate, such as a silicon-based substrate. The optical resonator is configured to intensify the gain of the light having the first frequency. Method 600 then proceeds to block 603 and generates, by the optical resonator, light having a second frequency in response to an intensity of the light having the first frequency exceeding a threshold power level. The threshold power level corresponds to an intensity at which the optical resonator can undergo a nonlinear photon generation process and generate photons at a different frequency. In some embodiments, the nonlinear photon generation process is an SBS process or optical frequency comb generation process.

At block 604, method 600 absorbs, by an absorbent material disposed in the optical resonator, the light having the first frequency in response to light having a third frequency that corresponds to an excitation frequency of the absorbent material. For example, in one embodiment the absorbent material is a diamond-based waveguide that includes nitrogen vacancies (point defects from atomic structure in the diamond waveguide introduced by Nitrogen atoms in the lattice of the waveguide). As previously described, the absorbent material is configured to absorb the light at the first frequency by exciting the absorbent material by a pump laser separate from the input light source. The pump laser can excite the absorbent material by emitting pump light at a frequency of 532 nm. In some embodiments, the pump laser may be coupled indirectly to the absorbent material outside of the optical resonator and on a different substrate.

Method 600 proceeds to block 606 and detects a change in output power of the optical resonator in response to the light having the first frequency being absorbed by the absorbent material. When the absorbent material in the optical resonator becomes excited, it will absorb at least a portion of the light at the first frequency. In response, the effective threshold level needed to undergo the nonlinear photon generation process will increase, which will decrease the output power as a function of the absorption by the absorbent material. When the intensity of the light is below the effective threshold power level due to absorption of photons by the absorbent material, the optical resonator can no longer undergo a nonlinear photon generation process to generate photons at the second frequency, and thus the output power of light at the second frequency will vanish or nearly vanish. An output device, such as a photodetector coupled to a processing system, can detect the change in output power. As shown in FIG. 5, an RF source can emit an electromagnetic field directed to the absorbent material that varies in frequency. As the electromagnetic field experienced by the absorbent material varies in frequency, the absorbent material may absorb photons at one or more frequencies in the electromagnetic field, and the output power of the optical resonator may change accordingly.

Proceeding to block 608, method 600 determines a characteristic of a magnetic field in response to the change in output power level of the optical resonator. For example, method 600 can determine the frequenc(ies) in the variable electromagnetic field that correspond to the change in output power of the optical resonator, and determine a characteristic of a magnetic field based on those frequenc(ies). Additionally, or alternatively, method 600 can determine when the output power level corresponds to a minimum value as the frequency of the electromagnetic field applied to the absorbent material changes. The minimum value corresponds to when the intensity of the light in the optical resonator is below the threshold power level needed to undergo the nonlinear photon generation process and can be used to determine one or more characteristics of a magnetic field experienced by a magnetometer that includes the absorbent material in the optical resonator. Characteristics of the magnetic field can include the strength of the magnetic field, or one or more components of the magnetic field in a three-dimensional coordinate system.

The methods and techniques described herein may be implemented, at least in part, in digital electronic circuitry, or with a programmable processor (for example, a special-purpose processor or a general-purpose processor such as a computer), firmware, software, or in various combinations of each. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instruction to, a data storage system, at least one input device, and at least one output device. Generally, a processor will receive instructions and data from a read-only memory and/or a random-access memory. Storage devices suitable for tangibly embodying computer program instructions and data include all forms of non-volatile memory, including by way of example semiconductor memory devices, such as erasable programmable read-only memory (EPROM), electrically erasable programmable read-only memory (EEPROM), and flash memory devices; magnetic disks such as internal hard disks and removable disks; magneto-optical disks; and digital video disks (DVDs). Any of the foregoing may be supplemented by, or incorporated in, specially-designed application-specific integrated circuits (ASICs).

EXAMPLE EMBODIMENTS

Example 1 includes a device, comprising: a substrate; at least one optical pathway disposed on the substrate and configured to receive light having a first frequency; a first optical resonator having nonlinear photon generation properties coupled to the at least one optical pathway, wherein the first optical resonator is configured to increase an intensity of the light having the first frequency, wherein when the intensity of the light having the first frequency exceeds a first threshold power level, the first optical resonator undergoes a nonlinear photon generation process to generate photons at a second frequency different from the first frequency, wherein the at least one optical pathway is configured to couple the light having the second frequency out of the first optical resonator at an output power level and to couple the light having the second frequency out of the substrate; and an absorbent material disposed in the first optical resonator, wherein the absorbent material is configured, in response to being excited by light having a third frequency that corresponds to an excitation frequency of the absorbent material, to absorb the light having the first frequency, wherein the absorbent material has a nonlinear optical susceptibility such that, by absorbing the light having the first frequency, the absorbent material is configured to adjust a threshold power level needed for the first optical resonator to undergo the nonlinear photon generation process from the first threshold power level to a second threshold power level higher than the first threshold power level, wherein when the intensity of the light having the first frequency is below the second threshold power level, the first optical resonator is not able to generate light having the second frequency, wherein the output power level of the light having the second frequency that is coupled out of the first optical resonator decreases in response to the intensity of the light having the first frequency being below the second threshold power level.

Example 2 includes the device of Example 1, wherein the absorbent material is a diamond-based absorbent material that includes nitrogen-vacancy point defects.

Example 3 includes the device of any of Examples 1-2, comprising a second optical resonator coupled to the at least one optical pathway, wherein the second optical resonator is configured to filter the light coupled out of the first optical resonator at the second frequency.

Example 4 includes the device of Example 3, wherein at least one of the first optical resonator or the second optical resonator comprises at least one heating element configured to control an optical path length of the first optical resonator or the second optical resonator.

Example 5 includes the device of any of Examples 1-4, wherein the nonlinear photon generation process includes a Stimulated Brillouin Scattering (SBS) process, or an optical frequency comb generation process.

Example 6 includes the device of any of Examples 1-5, wherein the first optical resonator is an optical parametric oscillator.

Example 7 includes a system, comprising: a first laser configured to transmit light at a first frequency; a photonics circuit coupled to the first laser, the photonics circuit comprising: a substrate; at least one optical pathway disposed on the substrate and configured to receive the light at the first frequency; a first optical resonator having nonlinear photon generation properties coupled to the at least one optical pathway, wherein the first optical resonator is configured to increase an intensity of the light at the first frequency, wherein when the intensity of the light at the first frequency exceeds a first threshold power level, the first optical resonator undergoes a nonlinear photon generation process to generate photons at a second frequency different from the first frequency, wherein the at least one optical pathway is configured to couple the light having the second frequency out of the first optical resonator at an output power level and to couple the light having the second frequency out of the substrate; an absorbent material disposed in the first optical resonator, wherein the absorbent material is configured, in response to being excited by light having a third frequency that corresponds to an excitation frequency of the absorbent material, to absorb the light having the first frequency, wherein the absorbent material has a nonlinear optical susceptibility such that, by absorbing the light having the first frequency, the absorbent material is configured to adjust a threshold power level needed for the first optical resonator to undergo the nonlinear photon generation process from the first threshold power level to a second threshold power level higher than the first threshold power level, wherein when the intensity of the light having the first frequency is below the second threshold power level, the first optical resonator is not able to generate light having the second frequency, a detector coupled to the at least one optical pathway and configured to detect the light having the second frequency at the output power level; an electromagnetic transmitter coupled to the absorbent material, wherein the electromagnetic transmitter is configured to transmit a frequency-varied electromagnetic wave to the absorbent material that varies over a frequency range; and at least one processor coupled to the detector, wherein the at least one processor is configured to determine a characteristic of a magnetic field in response to a change in the output power level.

Example 8 includes the system of Example 7, comprising a pump laser coupled to the absorbent material, wherein the pump laser is configured to excite the absorbent material by transmitting light at the third frequency that corresponds to the excitation frequency of the absorbent material.

Example 9 includes the system of any of Examples 7-8, wherein to determine a characteristic of a magnetic field in response to a change in the output power level comprises: determine one or more frequencies in the frequency range that correspond to the change in the output power level; and determine a characteristic of a magnetic field based on the one or more frequencies in the frequency range.

Example 10 includes the system of any of Examples 7-9, wherein the absorbent material is configured to absorb light at the third frequency at an absorption rate that changes as a function of the frequency-varied electromagnetic wave.

Example 11 includes the system of any of Examples 7-10, comprising a second optical resonator coupled to the at least one optical pathway, wherein the second optical resonator is configured to filter the light coupled out of the first optical resonator at the second frequency.

Example 12 includes the system of Example 11, wherein the absorbent material is configured to cause the first optical resonator to stop generating light at the second frequency when the absorbent material reduces the intensity of the light at the first frequency to an intensity below the threshold power level.

Example 13 includes the system of any of Examples 7-12, wherein the absorbent material is a diamond-based material that includes nitrogen vacancy defects.

Example 14 includes the system of any of Examples 8-13, wherein the detector is configured to detect a change in the output power level of the light at the second frequency in response to the intensity of the light at the first frequency falling below the threshold power level.

Example 15 includes a method, comprising: receiving, at a first optical resonator, light having a first frequency; generating, by the first optical resonator, light having a second frequency in response to an intensity of the light having the first frequency exceeding a first threshold power level; absorbing, by an absorbent material disposed in the first optical resonator, the light having the first frequency in response to receiving light having a third frequency that corresponds to an excitation frequency of the absorbent material, wherein the absorbent material has a nonlinear optical susceptibility such that, by absorbing the light having the first frequency, the absorbent material is configured to adjust a threshold power level needed for the first optical resonator to generate light having the second frequency from the first threshold power level to a second threshold power level higher than the first threshold power level; detecting a change in output power level of the first optical resonator in response to the light at the first frequency being absorbed; determining a characteristic of a magnetic field in response to the change in output power.

Example 16 includes the method of Example 15, comprising: transmitting a frequency-varied electromagnetic wave that varies over a frequency range; and absorbing, by the absorbent material, light having the first frequency at an absorption rate that changes as a function of the frequency-varied electromagnetic wave.

Example 17 includes the method of any of Examples 15-16, wherein generating light having a second frequency in response to an intensity of the light having the first frequency exceeding a threshold power level comprises generating the light having a second frequency with a nonlinear photon generation process based on nonlinear optical properties of the first optical resonator, wherein the nonlinear photon generation process includes a Stimulated Brillouin Scattering (SBS) process or an optical frequency comb process.

Example 18 includes the method of any of Examples 15-17, comprising exciting, by a pump laser coupled to the absorbent material, the absorbent material by transmitting light at the second frequency that corresponds to the excitation frequency of the absorbent material.

Example 19 includes the method of any of Examples 15-18, wherein absorbing the light having the first frequency comprises absorbing the light from a diamond-based material that includes nitrogen point vacancies.

Example 20 includes the method of any of Examples 15-19, comprising transmitting a frequency-varied electromagnetic wave to the absorbent material that varies over a frequency range; and wherein determining a characteristic of a magnetic field in response to the change in output power comprises: determining one or more frequencies in the frequency range that correspond to the change in output power of the first optical resonator; and determining a characteristic of a magnetic field based on the one or more frequencies in the frequency range.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A device, comprising:
   a substrate;
   at least one optical pathway disposed on the substrate and configured to receive light having a first frequency;
   a first optical resonator having nonlinear photon generation properties coupled to the at least one optical pathway, wherein the first optical resonator is configured to increase an intensity of the light having the first frequency, wherein when the intensity of the light having the first frequency exceeds a first threshold power level, the first optical resonator undergoes a nonlinear photon generation process to generate photons at a second frequency different from the first frequency, wherein the at least one optical pathway is configured to couple the light having the second frequency out of the first optical resonator at an output power level and to couple the light having the second frequency out of the substrate; and
   an absorbent material disposed in the first optical resonator, wherein the absorbent material is configured, in response to being excited by light having a third frequency that corresponds to an excitation frequency of the absorbent material, to absorb the light having the first frequency, wherein the absorbent material has a nonlinear optical susceptibility such that, by absorbing the light having the first frequency, the absorbent material is configured to adjust a threshold power level needed for the first optical resonator to undergo the nonlinear photon generation process from the first threshold power level to a second threshold power level higher than the first threshold power level, wherein when the intensity of the light having the first frequency is below the second threshold power level, the first optical resonator is not able to generate light having the second frequency, wherein the output power level of the light having the second frequency that is coupled out of the first optical resonator decreases in response to the intensity of the light having the first frequency being below the second threshold power level.

2. The device of claim 1, wherein the absorbent material is a diamond-based absorbent material that includes nitrogen-vacancy point defects.

3. The device of claim 1, comprising a second optical resonator coupled to the at least one optical pathway, wherein the second optical resonator is configured to filter the light coupled out of the first optical resonator at the second frequency.

4. The device of claim 3, wherein at least one of the first optical resonator or the second optical resonator comprises at least one heating element configured to control an optical path length of the first optical resonator or the second optical resonator.

5. The device of claim 1, wherein the nonlinear photon generation process includes a Stimulated Brillouin Scattering (SBS) process, or an optical frequency comb generation process.

6. The device of claim 1, wherein the first optical resonator is an optical parametric oscillator.

7. A system, comprising:
a first laser configured to transmit light at a first frequency;
a photonics circuit coupled to the first laser, the photonics circuit comprising:
a substrate;
at least one optical pathway disposed on the substrate and configured to receive the light at the first frequency;
a first optical resonator having nonlinear photon generation properties coupled to the at least one optical pathway, wherein the first optical resonator is configured to increase an intensity of the light at the first frequency, wherein when the intensity of the light at the first frequency exceeds a first threshold power level, the first optical resonator undergoes a nonlinear photon generation process to generate photons at a second frequency different from the first frequency, wherein the at least one optical pathway is configured to couple the light having the second frequency out of the first optical resonator at an output power level and to couple the light having the second frequency out of the substrate;
an absorbent material disposed in the first optical resonator, wherein the absorbent material is configured, in response to being excited by light having a third frequency that corresponds to an excitation frequency of the absorbent material, to absorb the light having the first frequency, wherein the absorbent material has a nonlinear optical susceptibility such that, by absorbing the light having the first frequency, the absorbent material is configured to adjust a threshold power level needed for the first optical resonator to undergo the nonlinear photon generation process from the first threshold power level to a second threshold power level higher than the first threshold power level, wherein when the intensity of the light having the first frequency is below the second threshold power level, the first optical resonator is not able to generate light having the second frequency, a detector coupled to the at least one optical pathway and configured to detect the light having the second frequency at the output power level;

an electromagnetic transmitter coupled to the absorbent material, wherein the electromagnetic transmitter is configured to transmit a frequency-varied electromagnetic wave to the absorbent material that varies over a frequency range; and at least one processor coupled to the detector, wherein the at least one processor is configured to determine a characteristic of a magnetic field in response to a change in the output power level.

8. The system of claim 7, comprising a pump laser coupled to the absorbent material, wherein the pump laser is configured to excite the absorbent material by transmitting light at the third frequency that corresponds to the excitation frequency of the absorbent material.

9. The system of claim 8, wherein the detector is configured to detect a change in the output power level of the light at the second frequency in response to the intensity of the light at the first frequency falling below the threshold power level.

10. The system of claim 7, wherein to determine a characteristic of a magnetic field in response to a change in the output power level comprises:
determine one or more frequencies in the frequency range that correspond to the change in the output power level; and
determine a characteristic of a magnetic field based on the one or more frequencies in the frequency range.

11. The system of claim 7, wherein the absorbent material is configured to absorb light at the third frequency at an absorption rate that changes as a function of the frequency-varied electromagnetic wave.

12. The system of claim 7, comprising a second optical resonator coupled to the at least one optical pathway, wherein the second optical resonator is configured to filter the light coupled out of the first optical resonator at the second frequency.

13. The system of claim 12, wherein the absorbent material is configured to cause the first optical resonator to stop generating light at the second frequency when the absorbent material reduces the intensity of the light at the first frequency to an intensity below the threshold power level.

14. The system of claim 7, wherein the absorbent material is a diamond-based material that includes nitrogen vacancy defects.

15. A method, comprising:
receiving, at a first optical resonator, light having a first frequency;
generating, by the first optical resonator, light having a second frequency in response to an intensity of the light having the first frequency exceeding a first threshold power level;
absorbing, by an absorbent material disposed in the first optical resonator, the light having the first frequency in response to receiving light having a third frequency that corresponds to an excitation frequency of the absorbent material, wherein the absorbent material has a nonlinear optical susceptibility such that, by absorbing the light having the first frequency, the absorbent material is configured to adjust a threshold power level needed for the first optical resonator to generate light having the second frequency from the first threshold power level to a second threshold power level higher than the first threshold power level;

detecting a change in output power level of the first optical resonator in response to the light at the first frequency being absorbed;

determining a characteristic of a magnetic field in response to the change in output power.

16. The method of claim 15, comprising:
transmitting a frequency-varied electromagnetic wave that varies over a frequency range; and
absorbing, by the absorbent material, light having the first frequency at an absorption rate that changes as a function of the frequency-varied electromagnetic wave.

17. The method of claim 15, wherein generating light having a second frequency in response to an intensity of the light having the first frequency exceeding a threshold power level comprises generating the light having a second frequency with a nonlinear photon generation process based on nonlinear optical properties of the first optical resonator, wherein the nonlinear photon generation process includes a Stimulated Brillouin Scattering (SBS) process or an optical frequency comb process.

18. The method of claim 15, comprising exciting, by a pump laser coupled to the absorbent material, the absorbent material by transmitting light at the second frequency that corresponds to the excitation frequency of the absorbent material.

19. The method of claim 15, wherein absorbing the light having the first frequency comprises absorbing the light from a diamond-based material that includes nitrogen point vacancies.

20. The method of claim 15, comprising transmitting a frequency-varied electromagnetic wave to the absorbent material that varies over a frequency range; and wherein determining a characteristic of a magnetic field in response to the change in output power comprises:

determining one or more frequencies in the frequency range that correspond to the change in output power of the first optical resonator; and
determining a characteristic of a magnetic field based on the one or more frequencies in the frequency range.

* * * * *